US006421223B2

(12) United States Patent
Marsh

(10) Patent No.: US 6,421,223 B2
(45) Date of Patent: *Jul. 16, 2002

(54) THIN FILM STRUCTURE THAT MAY BE USED WITH AN ADHESION LAYER

(75) Inventor: Eugene P. Marsh, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,209

(22) Filed: Mar. 1, 1999

(51) Int. Cl.[7] .......................... H01G 4/228; H01G 4/08; H01L 31/119
(52) U.S. Cl. .................... 361/306.3; 361/305; 361/311; 257/296
(58) Field of Search ............................. 361/305–306.3, 361/311–313, 320, 321.2, 321.1, 321.4, 321.5; 257/296, 301, 303, 306

(56) References Cited

U.S. PATENT DOCUMENTS

| 4,476,547 | A | * | 10/1984 | Miyasaka | 365/205 |
|---|---|---|---|---|---|
| 5,005,102 | A | | 4/1991 | Larson | 361/313 |
| 5,053,917 | A | | 10/1991 | Miyasaka et al. | 361/321 |
| 5,122,477 | A | | 6/1992 | Wolters et al. | 437/60 |
| 5,497,017 | A | * | 3/1996 | Gonzales | 257/306 |
| 5,532,956 | A | * | 7/1996 | Watanabe | 365/149 |
| 5,566,045 | A | * | 10/1996 | Summerfelt | 361/321.1 |
| 5,576,928 | A | * | 11/1996 | Summerfelt et al. | 361/321.1 |
| 5,581,436 | A | * | 12/1996 | Summerfelt et al. | 361/321.1 |
| 5,589,284 | A | * | 12/1996 | Summerfelt et al. | 428/697 |
| 5,604,659 | A | * | 2/1997 | Madan | 361/303 |
| 5,604,696 | A | * | 2/1997 | Takaishi | 361/149 |
| 5,608,247 | A | * | 3/1997 | Brown | 257/306 |
| 5,619,393 | A | * | 4/1997 | Summerfelt et al. | 361/321.1 |
| 5,723,171 | A | | 3/1998 | Cuchiaro et al. | 427/96 |
| 5,926,716 | A | * | 7/1999 | Tobben et al. | 438/381 |
| 5,939,294 | A | * | 8/1999 | Sandhu et al. | 438/255 |
| 5,952,687 | A | * | 9/1999 | Kawakubo et al. | 257/296 |
| 6,043,526 | A | * | 3/2000 | Ochiai | 257/295 |
| 6,049,103 | A | * | 4/2000 | Horikawa et al. | 257/303 |
| 6,051,859 | A | * | 4/2000 | Hosotani et al. | 257/306 |
| 6,080,617 | A | * | 6/2000 | Fuji et al. | 438/240 |
| 6,100,200 | A | * | 8/2000 | Van Buskirk et al. | 438/697 |
| 6,153,490 | A | * | 11/2000 | Xing et al. | 438/396 |

* cited by examiner

Primary Examiner—Dean A. Reichard
Assistant Examiner—Eric W. Thomas
(74) Attorney, Agent, or Firm—Kirkpatrick & Lockhart LLP

(57) ABSTRACT

A conductive structure, including an adhesion layer and a conductor in contact with the adhesion layer and having a thickness of less than six hundred Angstroms. The present invention may be used to form a capacitor, including an adhesion layer, a first conductor in contact with the adhesion layer and having a thickness of less than six hundred Angstroms, a second conductor, and a dielectric between the first and second conductors. The present invention is also directed towards structures wherein iridium or rhodium may be used in place of the combination of the adhesion layer and conductor.

10 Claims, 8 Drawing Sheets

THIN FILM STRUCTURE THAT MAY BE USED WITH AN ADHESION LAYER

CROSS REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention is directed generally to a structure having thin films that does not exhibit spotting and non-wetting characteristics and, more particularly, to a structure having thin films that may include an adhesion layer.

2. Description of the Background

Films used in integrated circuits are becoming thinner as minimum feature sizes decrease and as the competitive nature of integrated circuit fabrication forces manufactures to produce smaller parts (i.e. die) in order to produce smaller and less expensive integrated circuits.

A result of decreasing film thickness is that some materials will not form a conformal film below certain thicknesses. Instead, those materials exhibit "spotting" or "non-wetting" characteristics whereby the material forms "islands" separated by gaps where the material will not form. One example of such a material is platinum, which exhibits spotting when formed on silicon at a thickness less than about six hundred (600) Angstroms and then annealed to 700° C.

Platinum, as well as other materials, is important when forming integrated circuits because it exhibits desirable characteristics during fabrication steps. For example, platinum does not readily form an oxide during annealing in oxygen.

Therefore, the need exists for a structure having thin films that does not exhibit spotting or non-wetting characteristics.

BRIEF SUMMARY OF THE INVENTION

The present invention is directed to a conductive structure including an adhesion layer and a conductor in contact with the adhesion layer and having a thickness of less than six hundred Angstroms. The present invention may be used to form devices, such as capacitors. A capacitor constructed according to the present invention includes an adhesion layer, a conductor in contact with the adhesion layer and having a thickness of less than six hundred Angstroms, a second conductor, and a dielectric between the first and second conductors.

The present invention is also directed towards structures wherein iridium or rhodium may be used in place of the combination of the adhesion layer and conductor.

The present invention solves problems experienced with the prior art because it allows for the formation of thin films, such as platinum, without wetting effects. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements. Those of ordinary skill in the art will recognize that other elements may be desirable and/or required in order to implement the present invention. However, because such elements are well known in the art, and because they do not facilitate a better understanding of the present invention, a discussion of such elements is not provided herein.

Advantages of the present invention may be realized using a number of structures and technologies, such as doped silicon substrate, silicon-on-insulator, silicon-on-sapphire, and thin film transistor. The term substrate, as used herein, shall mean one or more layers or structures which may include active or operable portions of a semiconductor device formed on or in the substrate. A substrate is often, but not always, the lowest layer of material.

Figure 1:
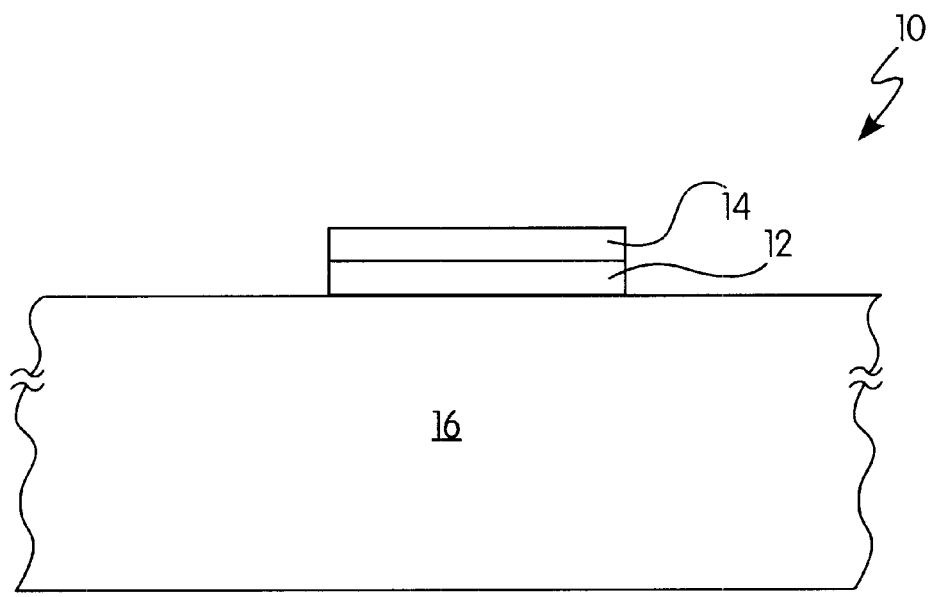
FIG. 1 is a cross-sectional view of a structure constructed according to the teachings of the present invention.

FIG. 1 is a cross-sectional view of a conductive structure 10 constructed in accordance with the present invention. The structure 10 includes an adhesion layer 12 and a conductor 14 in contact with the adhesion layer 12, both of which are formed on a substrate 16. As discussed hereinbelow, the structure 10 may take many forms such as, for example, electrical contacts and capacitors. The illustrated embodiment may be used, for example, as an electrical contact in an integrated circuit, such as may be used with an interconnect or with a die bond pad.

The adhesion layer 12 adheres to both the substrate 16 and the conductor 14, and has desirable properties when exposed to subsequent processing steps such as annealing. The adhesion layer 12 may be, for example, titanium, titanium nitride, tungsten carbide, tantalum nitride, tungsten nitride, noble metals, such as rhodium, iridium, osmium, and palladium; noble metal oxides, such as ruthenium oxide, rhodium oxide, iridium oxide, and osmium oxide; and silicides of those materials. Those materials adhere well to typical substrate materials, adhere well to typical conductors, and are generally unaffected by processing steps such as annealing.

The adhesion layer 12 may be formed by, for example, chemical vapor deposition ("CVD"). For an embodiment where the adhesion layer 12 is titanium nitride, the CVD process may be accomplished with a pressure of 0.5 torr, a deposition temperature of about 560° C., a flow rate of about 25 sccm of $NH_3$, a flow rate of about 25 sccm of nitrogen, and a flow rate of about 50 sccm of a carrier gas. Alternatively, the adhesion layer 12 may be formed, for example, by physical vapor deposition, such as sputter deposition, co-sputter deposition, evaporation deposition, and co-evaporation deposition. Once deposited, the adhesion layer 12 may be patterned as desired by, for example, conventional patterning techniques. Examples of conventional patterning techniques include lithography, etching (chemical or mechanical), and chemical mechanical polishing ("CMP").

The conductor 14 may be almost any conductor, including noble metals and noble metal oxides such as, for example, platinum, ruthenium, iridium, rhodium, palladium, osmium, oxides of those metals, and silicides of those metals. The conductor may have a thickness of less than six hundred (600) Angstroms. The conductor 14 will not exhibit "spotting" or "non-wetting" characteristics, even with a thickness of less than six hundred (600) Angstroms, because the adhesion layer 12, particularly the above-identified adhesion materials, causes the conductor 14 to form a conformal layer on the adhesion layer 12.

The conductor 14 may be formed; for example, by CVD and sputtering. For an embodiment where the conductor 14 is platinum and formed by CVD, the flow rate of the carrier gas may be about 10 to 5000 sccm, the deposition pressure may be about 0.4 to 10 torr, and the deposition temperature about 100° C. to 500° C. The CVD process may be performed without plasma enhancement, and diluent gas, such as nitrogen or argon, may be provided into the reaction chamber at a rate of up to about 500 sccm.

Once formed, the structure 10 may be annealed to aid causing the conductor 14 to form in a conformal layer on the adhesion layer 12. The annealing may be performed at a pressure of about 0.1 millitorr to about 5 atmospheres and at a temperature of about 650° C. or greater, but at a temperature less than the melting point of the substrate 16. The anneal may be performed for a time period of about 30 to 300 seconds. Further, the anneal may be performed while the structure 10 is present in a gas environment, such as in an atmosphere of oxygen, ozone, argon, nitrogen, helium, and a combination thereof. Once annealed, the conductor 14 forms directly on the patterned adhesion layer 12.

The anneal may be, for example, a rapid thermal oxidation (RTO) anneal or a rapid thermal nitridation (RTN) anneal. For a RTO anneal, the temperature may be 700–800° C. for a time period of approximately 30–60 seconds at 1 atm oxygen. For a RTN anneal, the temperature may be 700–800° C. for a time period of 30–60 seconds at 1 atm nitrogen.

Conductor material which is deposited on the substrate 16 and not on the adhesion layer 12 during deposition of the conductor 14 may be removed by exposing the structure 10 in a rinsing composition for a sufficient time period to remove the conductor material. Examples of suitable rinsing compositions include water, aqua regia, hydrofluoric acid, hydrophilic acid, hydrogen peroxide, and a combination thereof. The rinsing may be performed for a time period of about 5 minutes or less in a conventional ultrasonic bath.

The substrate 16 may be any of many materials, such as, for example, borophosphosilicate glass ("BPSG"), silicon dioxide, gallium arsenide, and $Al_2O_3$, and may be formed, for example, by CVD.

It has been found that iridium and rhodium offer superior characteristics that resist spotting. As a result, iridium or rhodium may be used to form a thin film less than six hundred Angstroms thick, without the spotting problems often associated with such thin films. Iridium or rhodium may be used in place of the combination of the adhesion layer 12 and the conductor 14 described herein. For example, and with reference to FIG. 1, iridium or rhodium may be used to form a conductive adhesion layer 12 that may be used without the conductor 14. Alternatively, iridium or rhodium may be used to form a conductor 14 that may be used without the adhesion layer 12.

Figure 2:
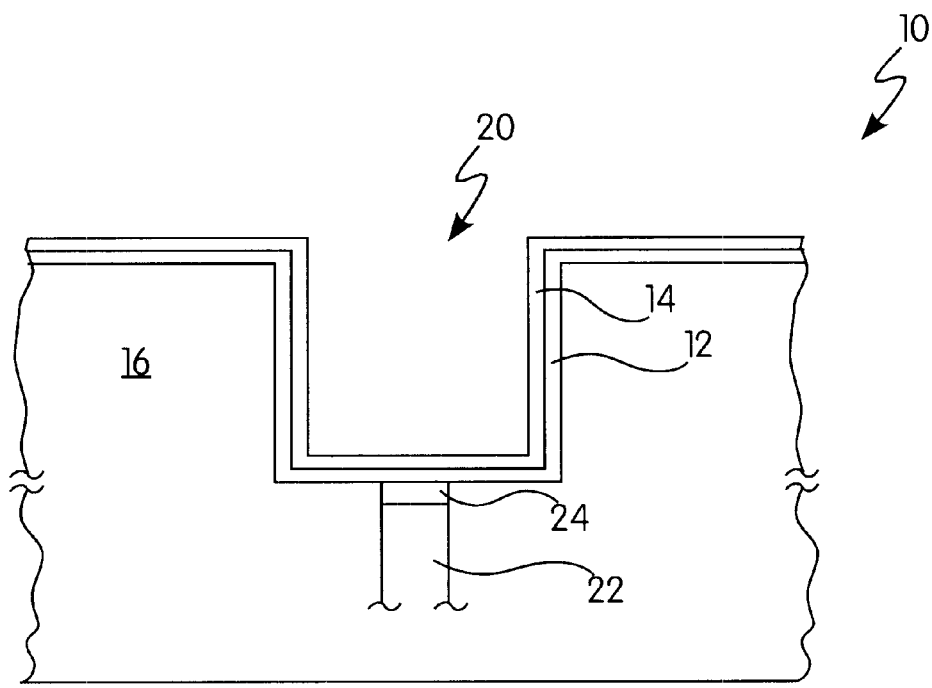
FIG. 2 is a cross-sectional view of a capacitor in an early stage of fabrication according to the teachings of the present invention.

FIG. 2 is a cross-sectional view of one embodiment of the structure 10 in an early stage of being fabricated into a capacitor. The adhesion layer 12 and conductor 14 are formed in an opening 20 in the substrate 16. The opening 20 may be formed, for example, by selectively masking the substrate 16 so that only the portion of the substrate 16 where the opening 20 is to be formed is exposed, by selectively and anisotropically etching the substrate 16 to form the opening 20, and then removing the mask. A conductive interconnect 22 may also be formed under the adhesion layer 12 to electrically connect the adhesion layer 12 and conductor 14 to another part of the device in which the structure 10 is formed. The interconnect 22 may be formed in a manner similar to that used to form the opening 20. The interconnect 22 may also include a contact 24 that has a lower resistance than the interconnect 22. In the case of the capacitor in the illustrated embodiment, the interconnect 22 and contact 24 may provide current to and from the conductor 14, which will form a plate and store charge in the capacitor. The interconnect 22 may be, for example, doped polysilicon, and the contact 24 may be, for example, selected from a group including TiN, Rhodium, Ruthenium, and Iridium.

Figure 3:
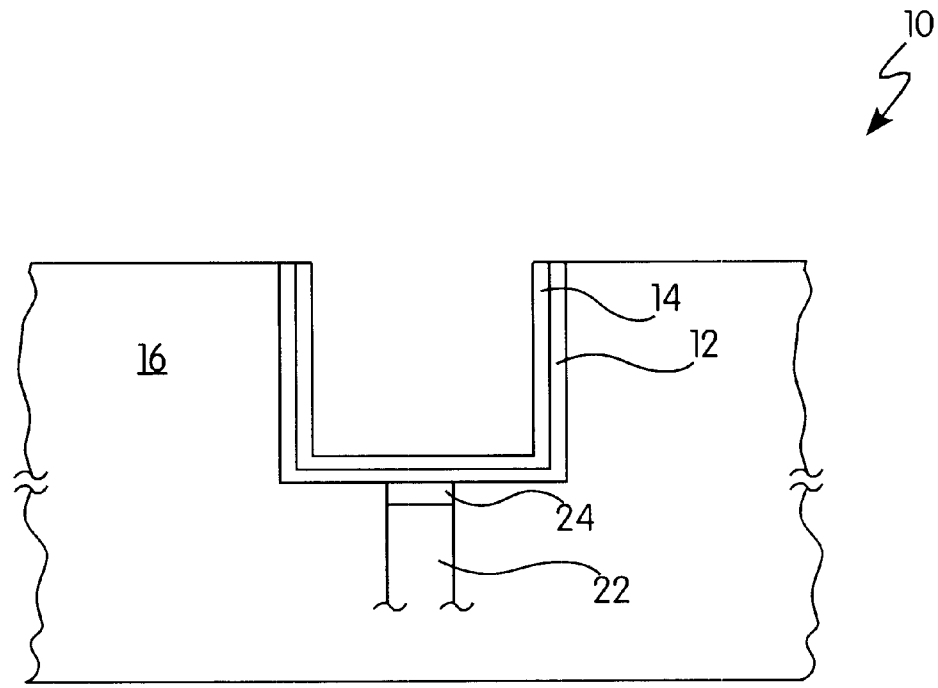
FIG. 3 is a cross-sectional view of the capacitor of FIG. 2 after the adhesion layer and conductor are removed from the top surface of the substrate.

FIG. 3 is a cross-sectional view of the structure 10 after the adhesion layer 12 and the conductor 14 have been removed from the top surface of the substrate 16. The removal may be performed by, for example, either a wet etch or a dry etch. In those examples, the opening 20 may be filled with a protective material, such as photoresist, to prevent the adhesion layer 12 and the conductor 14 from being etched. After the etch is completed, the protective material may be removed from the opening 20. Because some materials, such as platinum, are difficult to etch, a mechanical abrasion step, such as CMP, may be used to remove the adhesion layer 12 and conductor 14 from the top surface of the substrate 16. In that example, a protective material may be used to fill the opening 20 to prevent materials removed by the CMP from falling into the opening 20.

Figure 4:
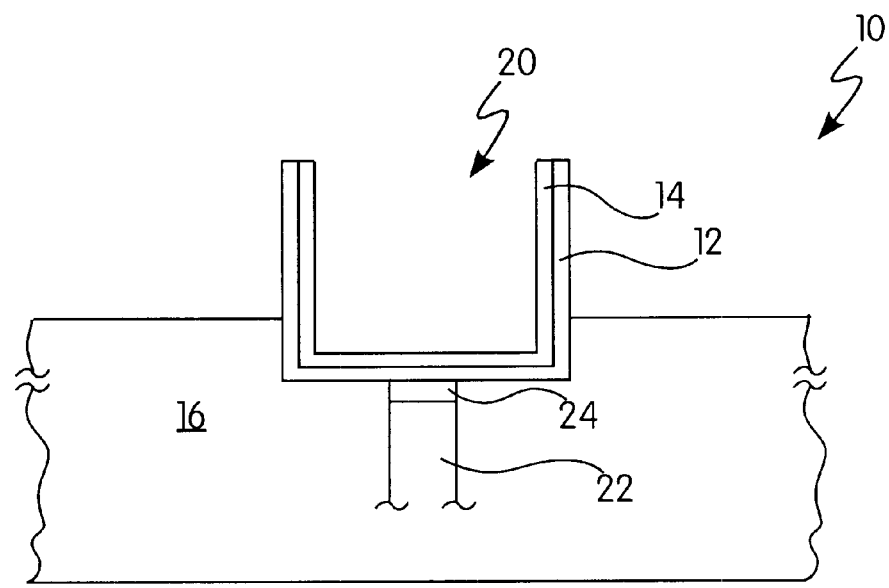
FIG. 4 is a cross-sectional view of the capacitor of FIG. 3 after a portion of the substrate is removed from around the adhesion layer and conductor.

FIG. 4 is a cross-sectional view of the structure 10 after a portion of the substrate 16 has been removed to expose vertical portions of the adhesion layer 12 and of the conductor 14. The substrate 16 may be removed by, for example, an etch that is selective to the substrate 16 but which does not etch the adhesion layer 12 and the conductor 14.

Figure 5:
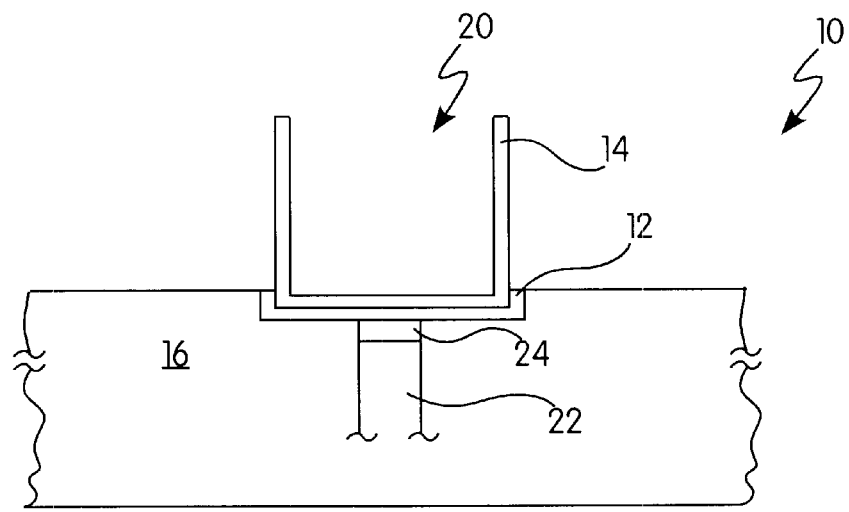
FIG. 5 is a cross-sectional view of the capacitor of FIG. 4 after the exposed portion of the adhesion layer is removed.

FIG. 5 is a cross-sectional view of the structure 10 after the exposed portion of the adhesion layer 12 is removed. The adhesion layer 12 may be removed with, for example, either a wet or a dry etch. As shown in FIG. 5, at least one end of the conductor 14 extends upwardly beyond the upper surface of the substrate 16.

Figure 6:
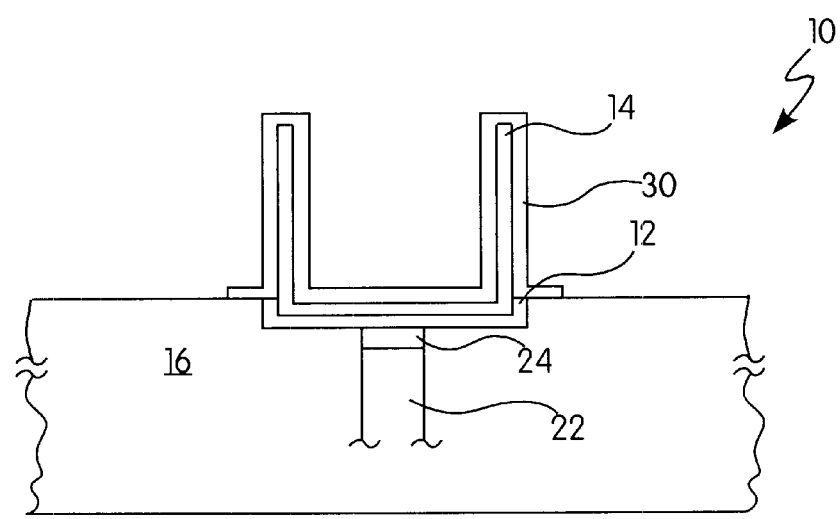
FIG. 6 is a cross-sectional view of the capacitor of FIG. 5 after a dielectric is formed on the conductor.

FIG. 6 is a cross-sectional view of the structure 10 after a dielectric 30 is formed on the conductor 14. The dielectric 30 is shown being formed on both sides of the conductor 14, although as described hereinbelow, the dielectric 30 may be formed on only one side of the conductor 14. The dielectric 30 may be, for example, selected from a group including $Ta_2O_5$, barium strontium titanate ("BST"), strontium titanate ("ST"), $Nb_2O_5$, $Y_2O_3$, $Ba(ZrTi)O_3$, $TiO_2$, $ZrO_2$, and $SrTiO_3$. The dielectric 30 may be formed, for example, by forming a layer of the dielectric 30 on the entire surface, and then selectively removing the dielectric 30 so that it remains only where desired. For example, the dielectric 30 may deposited over the entire surface by either sputtering or CVD, the dielectric 30 masked on both sides of the conductor 14 with photoresist, and the exposed dielectric removed with a selective etch.

Figure 7:
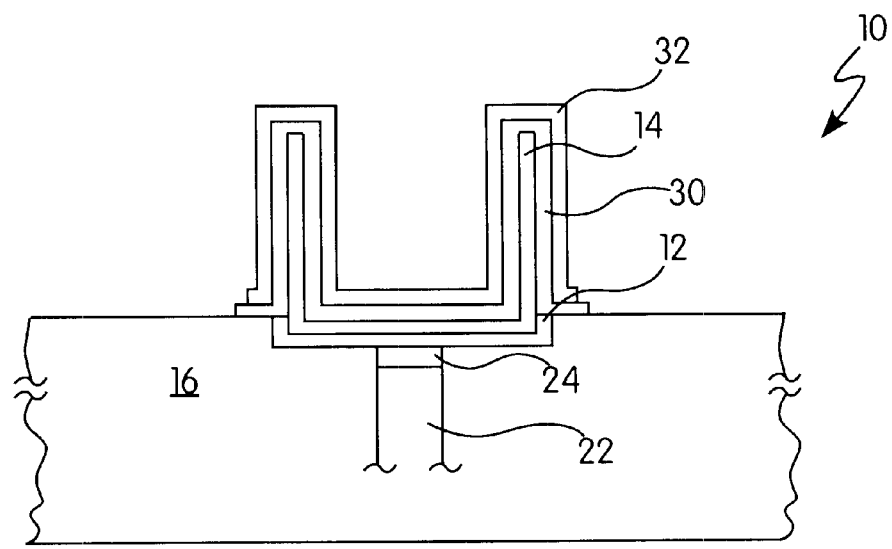
FIG. 7 is a cross-sectional view of the capacitor of FIG. 6 after a second conductor is formed on the dielectric.

FIG. 7 is a cross-sectional view of the structure 10 after a second conductor 32 is formed over the dielectric 30, thereby forming a capacitor. The second conductor 32 may be formed from the same or similar materials as the conductor 14 and in a manner similar to that used to form the dielectric 30. A greater variety of materials may be used for the second conductor 32 because the second conductor 32 may not be subject to extreme processing steps. For example, the second conductor 32 may be formed after the last high temperature processing step is completed. Examples of materials that may be used to form the second conductor 32 include platinum, ruthenium, iridium, rhodium, titanium nitride, tantalum nitride, tungsten nitride, aluminum, $RhO_2$, $RuO_2$, and Pd.

Many variations of the present invention are possible. For example, the structure may be formed without removing the adhesion layer 12. Also, the dielectric 30 and second conductor 32 may be formed on only one side of the conductor 14. Some embodiments will be described hereinbelow.

Figure 8:
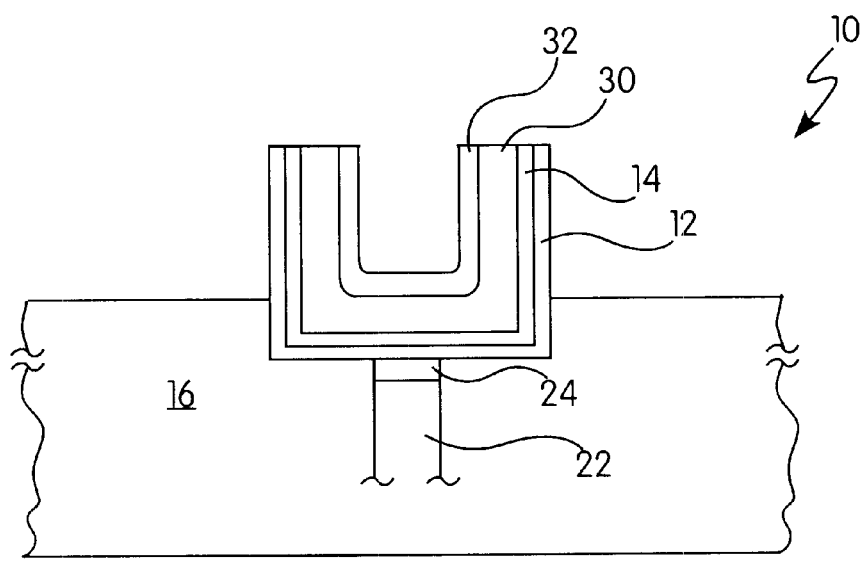
FIG. 8 is a cross-sectional view of a capacitor having a dielectric and second conductor formed only within the conductor and wherein the adhesion layer is not removed.

FIG. 8 is a cross-sectional view of an embodiment of the structure 10 wherein the dielectric 30 and the second conductor 32 have been formed within the conductor 14 and the adhesion layer 12 is not removed. The adhesion layer's 12 effectiveness as an oxygen barrier is one factor that may be used to determine whether to remove the adhesion layer 12. If the adhesion layer 12 is a good oxygen barrier, $Rh/RhO_2$ is one such example, it may be left on the conductor 14, as illustrated in FIG. 8.

Figure 9:
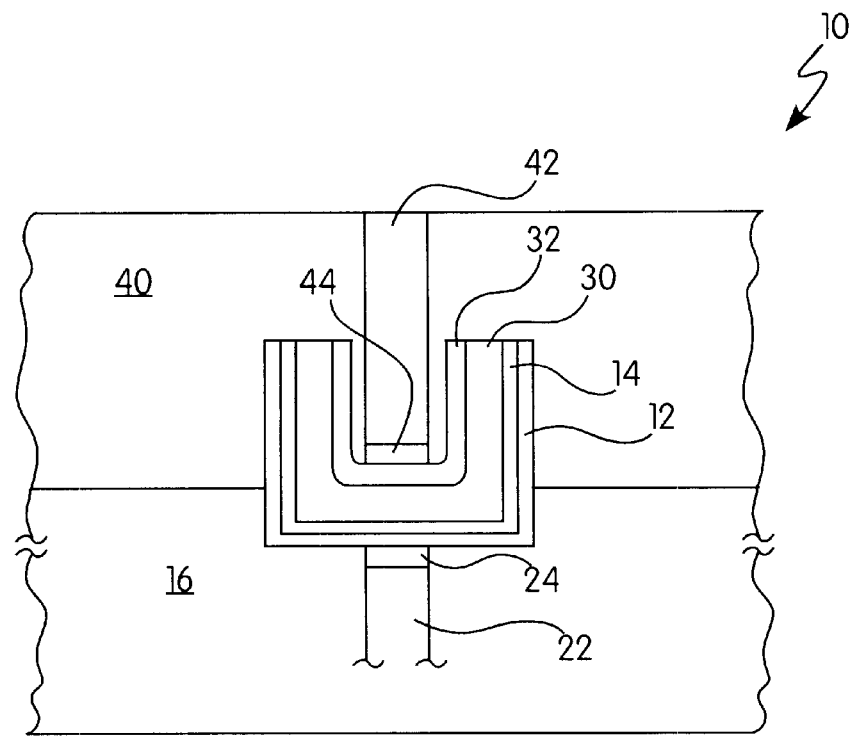
FIG. 9 is a cross-sectional view of the capacitor of FIG. 8 after an additional layer is formed over the capacitor.

FIG. 9 is a cross-sectional view of the structure 10 after an additional layer 40 is formed. The additional layer 40 may be used to separate the structure 10 from whatever may be formed above the structure 10. The additional layer 40 may be formed, for example, by a CVD process and from the same materials used to form the substrate 16. The additional layer 40 may be planarized, such as by CMP, and an interconnect 42 may be formed in the additional layer 40 to connect the second conductor 32 to another portion of the device in which the capacitor 10 is formed. As with the interconnect 22, the interconnect 42 may include a contact 44.

Figure 10:
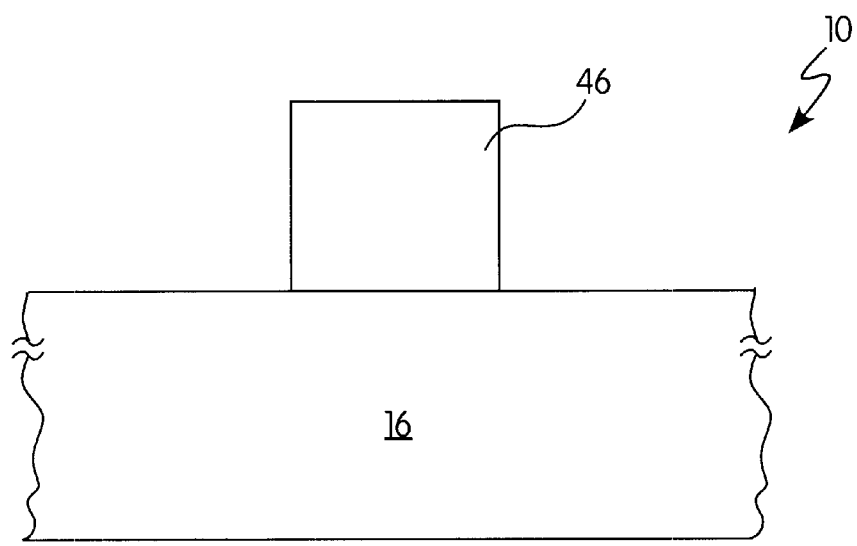
FIG. 10 is a cross-sectional view of a post capacitor in an early stage of fabrication according to the teachings of the present invention.

FIG. 10 is a cross-sectional view of a post 46 that will be used to form a post capacitor in accordance with the present invention. The post 46 may be formed, for example, by filling an opening in a temporary layer and then removing the temporary layer to leave the post 46. The post 46 may be formed from many materials such as, for example, polysilicon.

Figure 11:
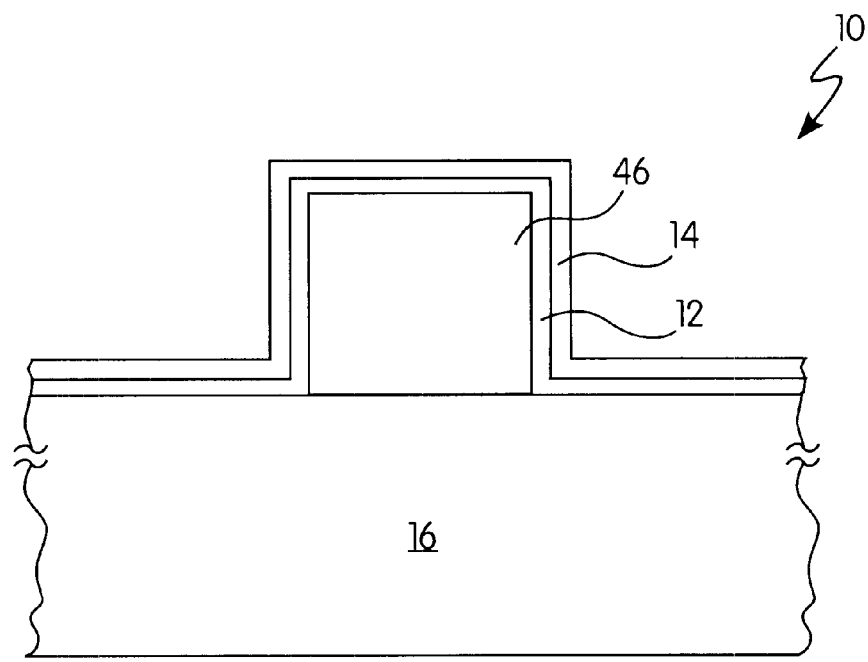
FIG. 11 is a cross-sectional view of the capacitor of FIG. 10 after an adhesion layer and a conductor are formed on the post.

FIG. 11 is a cross-sectional view of the structure 10 after the adhesion layer 12 and the conductor 14 are formed over the post 46. The adhesion layer 12 is formed before the conductor 14, and both may be formed in a manner such as described hereinabove.

Figure 12:
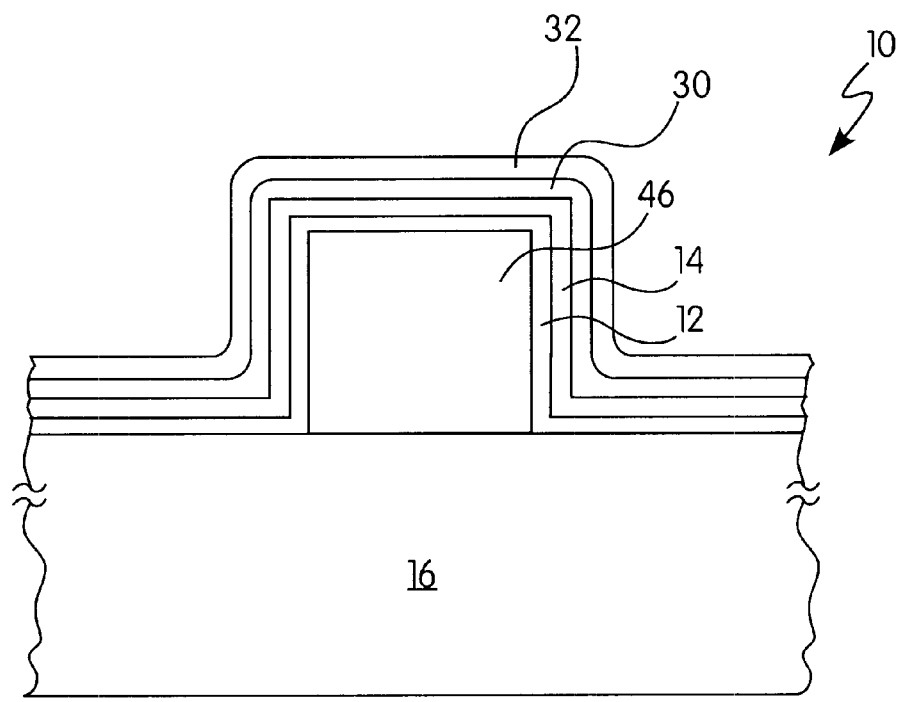
FIG. 12 is a cross-sectional view of the capacitor of FIG. 11 after a dielectric layer and a second conductor are formed on the adhesion layer and the conductor.

FIG. 12 is a cross-sectional view of the structure 10 after the dielectric 30 and the second conductor 32 are formed over the post 46. The dielectric 30 is formed before the second conductor 32, and both may be formed in a manner such as described hereinabove.

Figure 13:
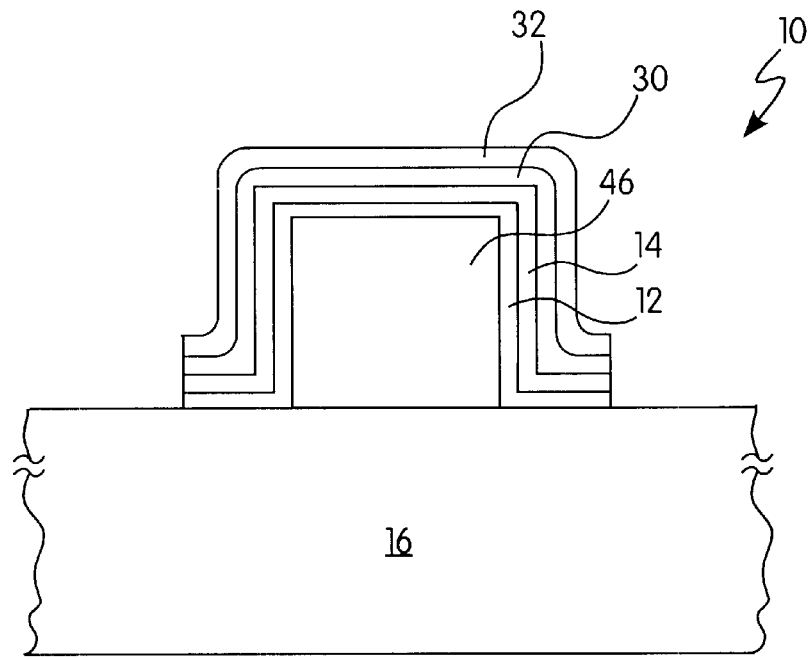
FIG. 13 is a cross-sectional view of the capacitor of FIG. 12 after portions of the adhesion layer, conductor, dielectric layer, and second conductor are removed.

FIG. 13 is a cross-sectional view of the structure 10 after the adhesion layer 12, the conductor 14, the dielectric 30, and the second conductor 32 are partially removed to leave a capacitor formed on the post 46. The removal may be performed such as, for example, by forming a mask over the portion to remain, etching the exposed portion of the adhesion layer 12, the conductor 14, the dielectric 30, and the second conductor 32, and removing the mask to leave the capacitor. The mask may be, for example, photoresist.

Figure 14:
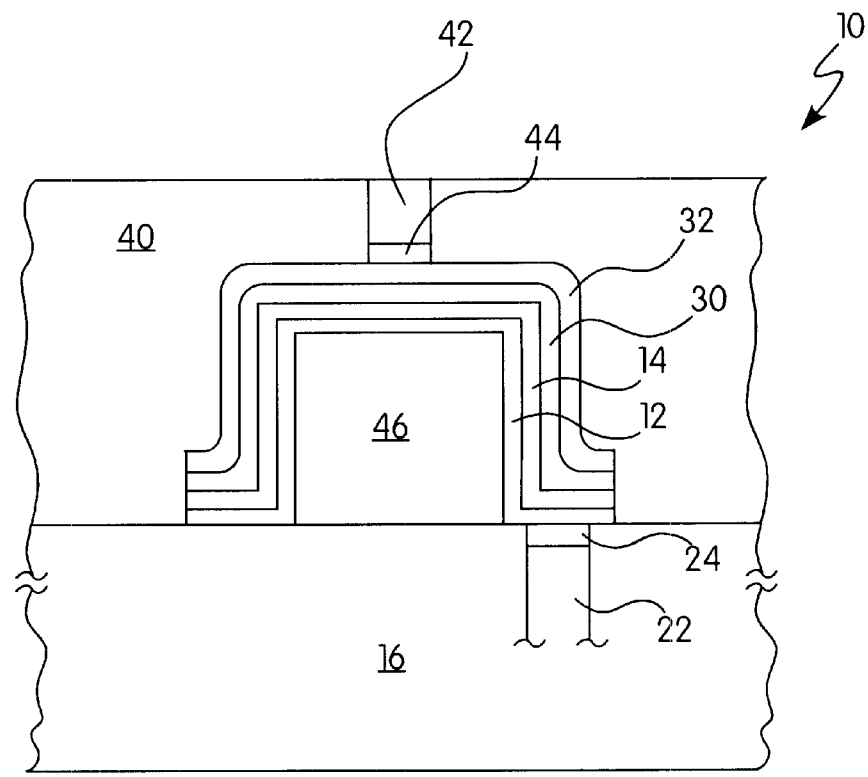
FIG. 14 is a cross-sectional view of the capacitor of FIG. 13 after an additional layer is formed over the capacitor.

FIG. 14 is a cross-sectional view of the structure 10 after an additional layer 40 has been formed over the capacitor. The additional layer 40 may be planarized, such as by CMP, and an interconnect 42 may be formed in the additional layer 40 to connect the second conductor 32 to another portion of the device in which the capacitor 10 is formed. The interconnect 42 may also include a contact 44. An interconnect 22 may also be formed to connect the adhesion layer 12 and the conductor 14 to another portion of the device in which the capacitor is formed. The interconnect 22 to the adhesion layer 12 is formed prior to the formation of the adhesion layer 12, the conductor 14, the dielectric 30, and the second conductor 32, in a manner similar to the interconnect 22 illustrated in FIG. 2.

Figure 15:
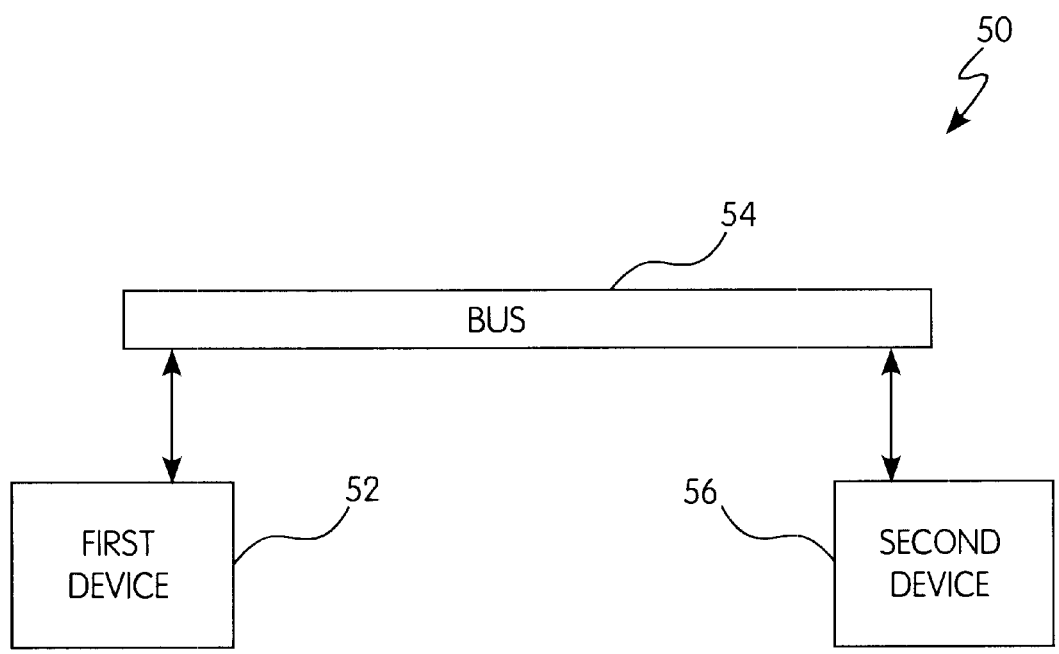
FIG. 15 is a block diagram of a system including devices constructed according to the teachings of the present invention.

FIG. 15 is a high level block diagram illustrating a system 50 including a first device 52, a bus 54, and a second device 56. The system 50 may be, for example, a memory system or a computer system. The first device 52 may be a processor, and the second device 56 may be a memory. The first device 52 and the second device 56 may communicate via the bus 54. The first and second devices 52, 56 may include structures 10, such as capacitors and contacts, constructed according to the teaching of the present invention.

The present invention also includes a method of forming structures and devices, such as capacitors. The method includes forming an adhesion layer 12 and forming a conductor 14 having a thickness of less than six hundred Angstroms on the adhesion layer 12. The adhesion layer 12 and the conductor 14 may be formed as described hereinbefore. When forming a capacitor, the method includes forming an adhesion layer 12, forming a conductor 14 having a thickness of less than six hundred Angstroms on the adhesion layer 12, forming a second conductor 32, and forming a dielectric 30 between the conductor 14 and the second conductor 32. The method may be used to form different types of capacitors, including post capacitors. When forming a post capacitor, the method may include forming the adhesion layer 12 on a post 46. Alternatively, the method may include forming the adhesion layer 12 in an opening 20. The adhesion layer 12 may have a first side and a second side, and the method may includes forming the conductor 14 on one of the first and second sides of the adhesion layer 12. Alternatively, the method may include forming the conductor 14 on both the first side of the adhesion layer 12 and on the second side of the adhesion layer 12, thereby increasing the capacitance of the capacitor.

An example of a method of forming a post capacitor according to the present invention includes providing a substrate 16, forming a post 46 on the substrate 16, forming an adhesion layer 12 on the post 46, forming a conductor 14 having a thickness of less than six hundred Angstroms on the adhesion layer 12, forming a second conductor 32, and forming a dielectric 30 between the conductor 14 and the second conductor 32.

An example of a method of forming a capacitor in an opening 20 includes providing a substrate 16, forming an opening 20 in the substrate 16, forming an adhesion layer 12 in the opening 20, forming a conductor 14 having a thickness of less than six hundred Angstroms on the adhesion layer 12, forming a second conductor 32, and forming a dielectric 30 between the conductor 14 and the second conductor 32.

Those of ordinary skill in the art will recognize that many modifications and variations of the present invention may be implemented. For example, one of the interconnects 22, 42 may be omitted and the corresponding conductor may be left to "float". In addition, iridium or rhodium may be used in place of the combination of adhesion layer 12 and conductor 14. The foregoing description and the following claims are intended to cover all such modifications and variations.

What is claimed is:

1. A capacitor, comprising:
   a substrate;
   an adhesion layer defining an opening and in contact with said substrate, wherein an upper surface of said adhesion layer is coplanar with an upper surface of said substrate;
   a first conductor in contact with said adhesion layer and having a thickness of less than six hundred Angstroms, wherein at least one end of the first conductor extends upwardly beyond the upper surface of the substrate;
   a second conductor; and
   a dielectric between said first conductor and said second conductor, wherein said dielectric includes a surface in direct contact with said upper surface of said adhesion layer.

2. The capacitor of claim 1, wherein said adhesion layer is selected from a group consisting of titanium, titanium alloys, tantalum alloys, noble metals, noble metal oxides, and silicides of titanium, titanium alloys, tantalum alloys, noble metals, and noble metal oxides.

3. The capacitor of claim 1, wherein said adhesion layer is selected from a group consisting of titanium, titanium nitride, tungsten carbide, tantalum nitride, tungsten nitride, titanium boride, tantalum boride, tungsten boride, zirconium boride, rhodium, iridium, osmium, palladium, ruthenium oxide, rhodium oxide, iridium oxide, osmium oxide, and silicides of titanium, titanium nitride, tungsten carbide, tantalum nitride, tungsten nitride, rhodium, iridium, osmium, and palladium.

4. The capacitor of claim 1, wherein said first conductor is selected from a group consisting of noble metals, noble metal oxides, and silicides of noble metals.

5. The capacitor of claim 4, wherein said first conductor is selected from a group consisting of platinum, ruthenium, iridium, rhodium, palladium, and osmium; oxides of platinum, ruthenium, iridium, rhodium, palladium, and osmium; and suicides of platinum, ruthenium, iridium, rhodium, palladium, and osmium.

6. The capacitor of claim 1, wherein said second conductor is selected from a group consisting of aluminum, titanium nitride, tantalum nitride, tungsten nitride, titanium boride, tantalum boride, tungsten boride, zirconium boride, platinum, ruthenium, iridium, rhodium, palladium, and osmium; oxides of platinum, ruthenium, iridium, rhodium, palladium, and osmium; and silicides of platinum, ruthenium, iridium, rhodium, palladium, and osmium.

7. The capacitor of claim 1, wherein said dielectric is selected from a group consisting of $Ta_2O_5$, barium strontium titanate ("BST"), strontium titanate ("ST"), $Nb_2O_5$, $Y_2O_3$, $Ba(ZrTi)O_3$, $TiO_2$, $ZrO_2$, and $SrTiO_3$.

8. The capacitor of claim 1, wherein:
   said adhesion layer has an inside surface defining said opening and an outside surface in contact with said substrate;
   said first conductor is in contact with said inside surface of said adhesion layer but is not in contact with said outside surface of said adhesion layer; and
   said dielectric is in contact with said first conductor but is not in contact with said outside surface of said adhesion layer.

9. A system, comprising:
   a bus;
   a first device connected to said bus, said first device including a capacitor; and
   a second device connected to said bus, wherein said capacitor includes:
   a substrate;
   an adhesion layer defining an opening and in contact with said substrate, wherein an upper surface of said adhesion layer is coplanar with an upper surface of said substrate;
   a first conductor in contact with said adhesion layer and having a thickness of less than six hundred Angstroms, wherein at least one end of the first conductor extends upwardly beyond the upper surface of the substrate;
   a second conductor; and
   a dielectric between said first conductor and said second conductor, wherein said dielectric includes a surface in direct contact with said upper surface of said adhesion layer.

10. The system of claim 9, wherein said first device is selected from the group consisting of a processor and a memory.

* * * * *

UNITED STATES PATENT AND TRADEMARK OFFICE
CERTIFICATE OF CORRECTION

PATENT NO.    : 6,421,223 B2                                                    Page 1 of 1
DATED         : July 16, 2002
INVENTOR(S)   : Marsh It is certified that error appears in the above-identified patent and that said Letters Patent is hereby corrected as shown below:

<u>Column 8,</u>
Line 14, please delete the word "suicides" and insert the word -- silicides -- therefor.

Signed and Sealed this

Twenty-eighth Day of January, 2003

JAMES E. ROGAN
*Director of the United States Patent and Trademark Office*